United States Patent

Barjesteh et al.

Patent Number: 5,633,117
Date of Patent: May 27, 1997

[54] PROVIDING IMAGEWISE VARIATION IN GLOSSINESS TO A RECEPTOR

[75] Inventors: Hamid Barjesteh, Woodbury; Michael B. Heller, Grove Heights, both of Minn.

[73] Assignee: Imation Corp., St. Paul, Minn.

[21] Appl. No.: 429,928

[22] Filed: Apr. 27, 1995

[51] Int. Cl.$^6$ ............................................. G03F 7/30
[52] U.S. Cl. ................... 430/256; 430/257; 430/950; 430/293
[58] Field of Search ........................ 430/256, 950, 430/257, 293

[56] References Cited

U.S. PATENT DOCUMENTS

| | | | |
|---|---|---|---|
| 3,671,236 | 6/1972 | Beusekom | 96/15 |
| 3,775,113 | 11/1973 | Bonham et al. | 96/28 |
| 4,228,232 | 10/1980 | Rousseau | 430/271 |
| 4,260,673 | 4/1981 | Krech | 430/143 |
| 4,286,046 | 8/1981 | Cohen et al. | 430/293 X |
| 4,294,909 | 10/1981 | Lee | 430/29 |
| 4,304,923 | 12/1981 | Rousseau | 560/26 |
| 4,336,319 | 6/1982 | Nagashima et al. | 430/950 X |
| 4,376,159 | 3/1983 | Spechler | 430/293 |
| 4,544,619 | 10/1985 | Christensen et al. | 430/256 X |
| 4,560,636 | 12/1985 | Stahlhofen | 430/950 X |
| 4,650,738 | 3/1987 | Platzer et al. | 430/143 |
| 4,656,114 | 4/1987 | Cederberg et al. | 430/160 |
| 4,659,642 | 4/1987 | Platzer et al. | 430/143 |
| 4,666,817 | 5/1987 | Sachi | 430/160 |
| 4,695,527 | 9/1987 | Geissler et al. | 430/256 |
| 4,719,169 | 1/1988 | Platzer et al. | 430/258 |
| 4,751,166 | 6/1988 | Platzer et al. | 430/160 |
| 4,772,533 | 9/1988 | Platzer et al. | 430/166 |
| 4,808,508 | 2/1989 | Platzer | 430/143 |
| 4,869,993 | 9/1989 | Farahat et al. | 430/143 |
| 4,902,594 | 2/1990 | Platzer | 430/14 |
| 4,935,331 | 6/1990 | Platzer et al. | 430/254 |
| 4,948,693 | 8/1990 | Shadrach et al. | 430/143 |
| 4,999,266 | 3/1991 | Platzer et al. | 430/14 |
| 5,176,978 | 1/1993 | Gifford et al. | 430/15 |
| 5,248,583 | 9/1993 | Lundquist et al. | 430/263 |
| 5,258,247 | 11/1993 | Platzer | 430/14 |
| 5,258,261 | 11/1993 | Heller | 430/273 |
| 5,298,361 | 3/1994 | Bonham | 430/260 |

FOREIGN PATENT DOCUMENTS

| | | |
|---|---|---|
| 0 529 537 A1 | 8/1992 | European Pat. Off. . |
| 2073249 | 3/1990 | Japan . |
| 4151652 | 5/1992 | Japan . |
| 05092538 | 4/1993 | Japan . |
| 7-49565A | 2/1995 | Japan ............. 430/950 |
| 2066491 | 7/1980 | United Kingdom ......... 430/256 |

OTHER PUBLICATIONS

English translation of Japanese Kokai Patent Application 7[1995]-49565 Dotomo et al, 24 pages.
95-126564-Derwent Information LTD English Abstract of Japanese JP 07-49565A, Ootomo et al, 1995, Feb. 21.
122:303096CA, Chemical Abstracts, ACS, English Abstract and online information for Japanese Abstract 7-49565, dated Feb. 21, 1995.

*Primary Examiner*—Cynthia Hamilton
*Attorney, Agent, or Firm*—Susan Moeller Zerull

[57] ABSTRACT

This invention is a surface modifying element comprising a photosensitive layer on one side of a carrier substrate. The photosensitive layer comprises a photosensitive binder material and particulates. The invention is also a method of using the surface modifying element to create a receiver having imagewise variation in glossiness.

6 Claims, 2 Drawing Sheets

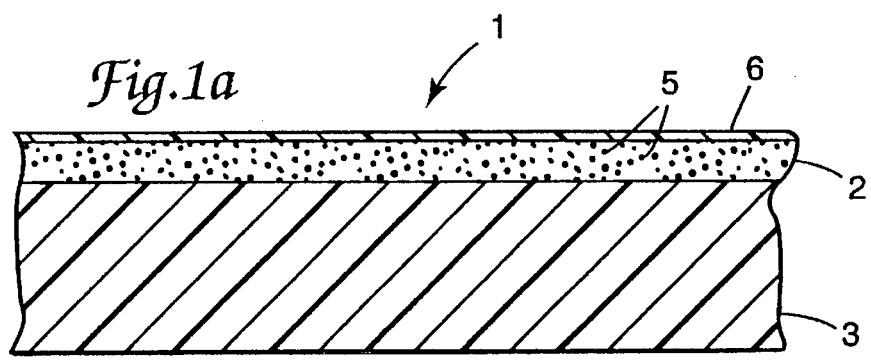
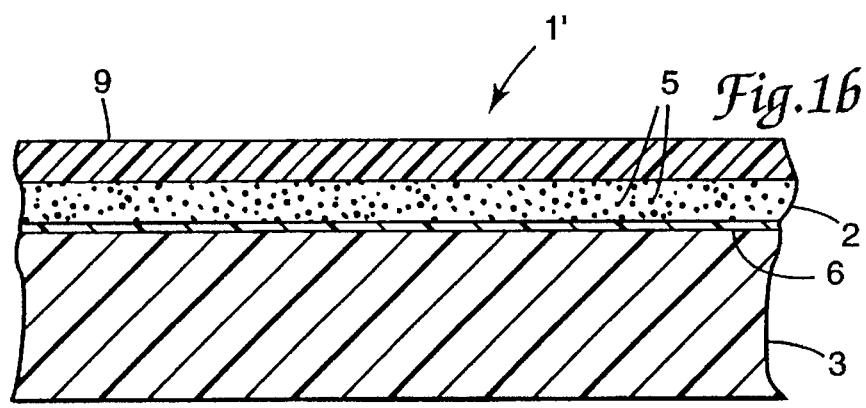
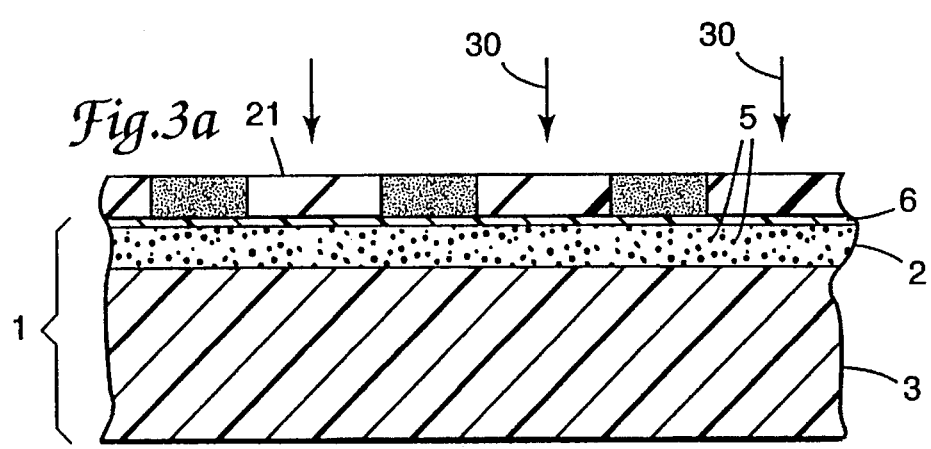
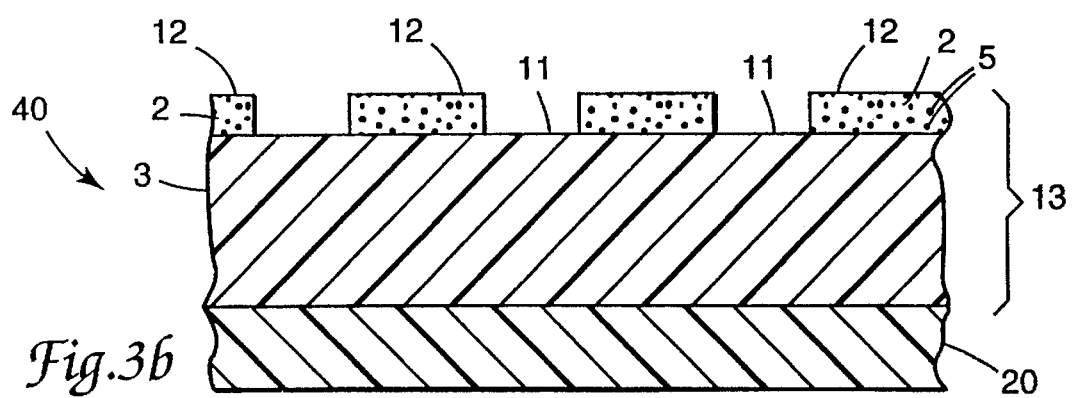

PROVIDING IMAGEWISE VARIATION IN GLOSSINESS TO A RECEPTOR

FIELD OF THE INVENTION

This invention relates to a method for providing imagewise variation in gloss to a receptor, especially a proof, and to a photosensitive element used in that method.

BACKGROUND OF THE INVENTION

In printing pictorial matter, whether by lithography, letterpress or gravure, the halftone process is used, in which the actual printed image is composed of thousands of minute dots per square inch of a single color ink of varied dot size or ink density. What the eye sees as shading in halftone prints is actually controlled variation in the size of dots relative to the unprinted areas between the dots. In black and white pictorial matter the dots are printed in black ink only. Full color reproductions, however, are printed in each of at least cyan, magenta and yellow, and, optionally, black. For each color a separate printing plate is made. In order to make the three or four printing plates, the original color picture or photograph is "separated" photographically, with the use of filters, masks, etc. into three or four half-tone negatives, each representing one of the colors, and containing, dot for dot, the amount of that color which must be printed to produce the desired total color print. The preparation of color-separation negatives is an art and requires considerable skill in handling the many variables. Often trial and error is involved, requiring correction or replacement of one or more of the negatives. Unless some reliable system is available to "proof" the negatives, the printing press must be set up and a copy printed just to secure preliminary proofs. This is time consuming and expensive. It is therefore desirable to provide accurate means for proofing the negatives without printing.

Various color proofing systems have been developed to efficiently and economically address the problem of proofing negatives. One system for proofing color separation negatives involves providing a transparent sheet for each of the colors to be printed. Each of the sheets is exposed through its respective color separation negative. Upon processing, the color in the non-image areas is removed, yielding a sheet which contains the desired color pattern in the image areas, while being colorless and transparent in the non-image areas. After each of the separate sheets is made, they are assembled together in registry on a white background to yield a color proof.

An alternate system involves producing images corresponding to each color and integrally building the images up on a single substrate. The multiplicity of carrier films is eliminated by transferring individual color images from a sheet typically comprised of (1) a carrier with release surface, (2) pigment and binder layer, (3) photohardenable or insolubilizable layer, (4) barrier layer, and (5) pressure-sensitive adhesive layer. See e.g., U.S. Pat. No. 3,671,236.

To properly anticipate the final printed image, the surface of both black-and-white and color proofs may be modified. Typically, this entails providing a varnish or gloss to the proof or providing the proof with a matte surface. A matte surface, for example, is readily provided by embossing the surface of the proof. A glossy surface may be inherent in the color image sheets or may be provided by adding an additional glossy layer or coating.

At times it may be desirable to provide gloss or matte surfaces over only a portion of the proof. For example it may be desirable to have an image of an object which has water droplets on it. One very effective way to convey the water droplets is to make those portions glossier than the rest of the image. Unfortunately, those methods previously taught for providing a glossy or a matte surface are not easily used to provide image-wise variation in gloss, i.e. a surface that is glossy in part, and matte in part. "Matte" and "gloss" are used herein as relative rather than absolute terms. Surfaces referred to as "matte" are merely visibly less glossy than are those referred to as "gloss".

SUMMARY OF THE INVENTION

This invention provides an efficient means of creating a proof having image-wise variation in gloss. Accordingly, this invention is a surface modifying element comprising a photosensitive layer on one side of a carrier substrate. The photosensitive layer comprises a photopolymerizable or photosolubilizable binder material and surface modifying particulate matter.

According to one embodiment, the invention is also a method of creating a receptor having imagewise variation in glossiness comprising the steps of:

a) providing a surface modifying sheet which comprises a carrier substrate, and, on one side of the carrier substrate, a photosensitive layer comprising i) a binder selected from the group consisting of photopolymerizable binders and photosolubilizable binders and ii) particulates having sizes in the range of 500 to 1500 nm;

b) image-wise exposing the photosensitive layer to actinic radiation;

c) developing the imagewise exposed photosensitive layer; and d) applying the imaged and developed surface modifying sheet to the receptor.

According to another embodiment this invention comprises a method of creating a receptor having imagewise variation in glossiness comprising the steps of:

a) providing a surface modifying sheet which comprises a carrier substrate, and, on one side of the carrier substrate, a photosensitive layer comprising i) a binder selected from the group consisting of photopolymerizable binders and photosolubilizable binders and ii) particulates having sizes in the range of 500 to 1500 nm;

b) applying the surface modifying sheet to the receptor in a manner so that the photosensitive layer is between the receptor and the carrier substrate;

c) removing the carrier substrate;

d) image-wise exposing the photosensitive layer to actinic radiation; and e) developing the imagewise exposed photosensitive layer, wherein the photosensitive layer may be imagewise exposed to actinic radiation before the application of the surface modifying sheet to the receptor, after the application of the surface modifying sheet to the receptor and before removal of the carrier substrate, or after the removal of the carrier substrate.

BRIEF DESCRIPTION OF THE DRAWINGS

FIGS. 1a and 1b show exemplary embodiments of the surface modifying sheet of the present invention.

FIGS. 3a–3b show an exemplary method of using a surface modifying sheet to impart imagewise variation in glossiness to a receptor.

DETAILED DESCRIPTION OF THE INVENTION

The Surface Modifying Element

Figure 2A:
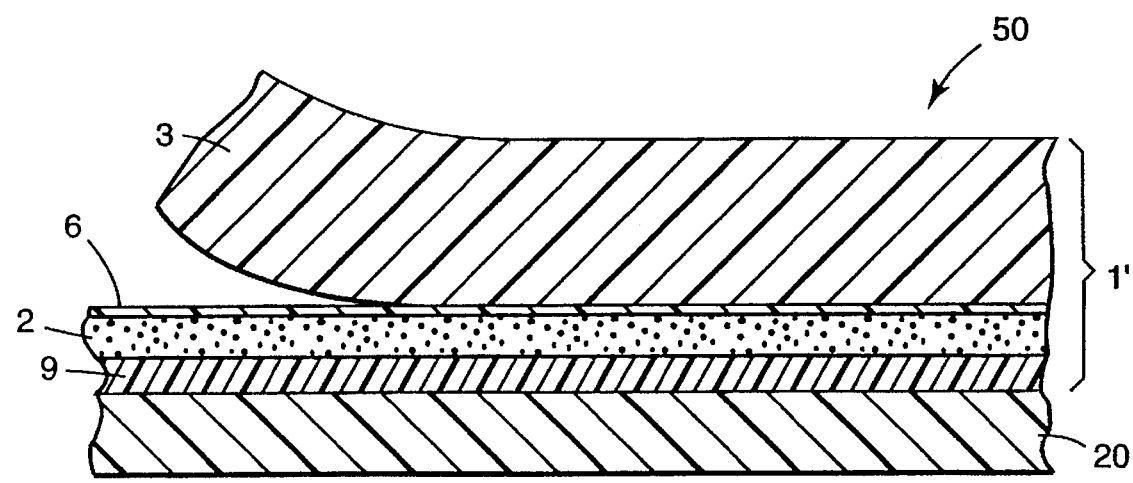
FIGS. 2a–2c show an exemplary method of using a surface modifying sheet to impart imagewise variation in glossiness to a receptor.

Referring to FIGS. 1a and 1b, this invention is a surface modifying element 1 or 1' useful in imparting a surface having image-wise variations in glossiness to a receptor. The surface modifying element comprises a photosensitive layer 2 on one side of a carrier substrate 3. The surface modifying effect is provided by the inclusion of particulate surface modifying agents 5 in the photosensitive layer 2. Preferably the photosensitive layer is colorless and transparent exclusive of surface effects created by the particulate surface modifying agents 5.

If a positive image transfer is desired, the photosensitive layer 2 may be a thermoplastic photosolubilizable layer, which, after imagewise exposure, is developed to remove the exposed areas. Any known photosolubilizable composition may be used provided that it is substantially colorless. Examples of such photosolubilizable compositions include the quinone diazide-containing compositions which become alkaline solvent-soluble on exposure to light, e.g., compositions containing quinone diazide sulfonic acid esters of polyhydric arylene compounds; quinone diazide sulfonic acid amides; quinone diazide aryl sulfones; hydrazine derivatives of quinone diazide sulfonic acids; azole amides of quinone diazide sulfonic acids; quinoline quinone diazides; and orthoquinone diazides such as naphthoquinone-(1, 2)-diazodido-(2)-5-sulfo-acid ester of 4-tertiary butylphenol. Other thermoplastic photosolubilizable compositions may contain imino quinone diazides; diazonium compounds; azidoarylamidazoles; diazo oxide; and azide polymers.

A negative system is preferred in which the photosensitive layer 2 is a photohardenable or photopolymerizable layer which is developed after imagewise exposure to actinic radiation by removal of the unexposed portions. Many photopolymerizable systems are known. These photopolymerizable systems will work well provided they are substantially colorless. Suitable photopolymerizable systems may comprise a photoinitiator and free radical polymerizable oligomers and/or monomers. The free radical polymerizable oligomers may be ethylenically unsaturated oligomers. The photopolymerizable oligomer comprises a multifunctional acrylate which forms a high molecular weight polymer upon initiation by light generated radicals. The molecular weight of the acrylated oligomer influences several performance characteristics of the final coated film such as the tack of the coated film, the strength of the developer necessary to develop the image and the quality of the image attained. If the film imparts too much tack then it is difficult to manufacture the material in a production coating process without disruption of the film. This would give rise to poor coating quality. The strength of the developer required to develop the image is directly proportional to the molecular weight of the oligomer and the acid content of oligomer. Oligomers with lower molecular weights and high acid content are easier to develop and therefore do not need very aggressive developers. Compositions of acrylated epoxy oligomers can be altered to achieve a balance between tack, developability and solution stability through the molecular weight of the material and the acid/amine content of the material. The preferred acrylated epoxy oligomer to achieve a coating which has acceptable tack has a mean molecular weight range of 2,400 to 5,000 and more preferably in the range of 2,400 to 3,500; and is present in the composition in the amount of 45–70% by weight (more preferably in the amount of 50–65%). Other acrylated oligomers which have shown utility include urethane oligomers as described in U.S. Pat. No. 4,304,923. The preferred acrylated urethane oligomers to achieve a coating which has acceptable tack has a mean molecular weight range of 2,500 to 7,500 and more preferably in the range of 3,000 to 5,000; and is present in the composition in the amount of 45–70% by weight.

Various photoinitiators may be used provided they do not generate visible color change to the photohardenable layer. Examples of photoinitiators non-exclusively include; triazines, acetophenones, benzophenones, and thioxanthones. The preferred photoinitiators include Irgacure™ 907(2-methyl-1-(4-(methylthio)phenyl)-2-(4-morpholinyl)-1-propane) from Ciba Geigy, Irgacure™ 369 from Ciba Geigy, Quantacure™ ITX(isopropylthioxanthone) from Biddle Sawyer and triazines tethered to alkylarylpolyether alcohols and are present in the composition in the amount of 1.0–25% by weight. The optimum amount of initiator will be dependent upon the oligomer type used.

By including particulate surface modifying agents 5 in the photosensitive layer 2 a variation in surface characteristics may be created. These particulate surface modifying agents 5 preferably do not add color to the photosensitive layer, although very slight tints may be tolerable. Suitable particulate surface modifying agents include materials such as silica, polymeric beads, glass beads, or mica. However, silica ($SiO_2$) and $TiO_2$ are preferred. The size of the particulate surface modifying agents must be smaller than the thickness of the photosensitive layer. If the particles are larger than the thickness of the photosensitive layer, the particles may cause embossing on the carrier substrate or the receptor thereby causing an overall matte appearance rather than an imagewise variation in glossiness. Large particles may also cause scratching as they are removed during development. The particulate surface modifying agents preferably have average particle size in the range of 500 to 1500 nm, more preferably 800 to 1300 nm, and a polydispersity index less than 1, more preferably less than 0.5 as measured by a Malvern Zetasizer 3 with sizing cell AZ10. One commercially available example of suitable particles is amorphous fumed silica particles sold as Cab-o-Sil by Cabot Co. The size and amount of particulates added may be varied to achieve various levels of matte appearance. However, preferably the amount of particulates used is from 1 to 30, more preferably from 3 to 20, % by weight of the photosensitive layer.

Other optional ingredients may be added to the photosensitive layer provided that they do not add color to the layer. Such ingredients may include surfactants, coating aids, plasticizers, residual solvents, etc.

The photosensitive layer 2 is coated onto the carrier substrate 3 using a solvent or mixture of solvents to give optimum coating quality and solution stability. Representative solvents include ketones, alkyl ethers or acetates of propylene glycol, alkyl ethers or acetates of ethylene glycol, dioxolane, butyrolactone, and alcohols. The thickness of the photosensitive layer is preferably 0.3 to 5 μm, more preferably 1 to 2 μm.

The carrier substrate 3 may be a flexible sheet, preferably of a polymeric material. If the carrier substrate is laminated to and remains on the proof or, if an overlay imagewise deglossing sheet is to be made, the substrate material must be clear. Suitable supports include polyesters such as polyethylene terephthalate, polyamides such as hexamethylenediamine adipamide, polyolefins, vinyl polymers such as polyvinylchloride, and polyethylene-coated paper. The thickness of the carrier substrate is preferably about 25 to 100 µm.

In an overlay system, one places transparent sheets bearing a single color image (or in the case of this application a degloss image) over one another. These individual overlays are not laminated to each other but rather are removably placed over each other to view the full color, image-wise deglossed image. FIGS. 3a–3b disclose such an overlay system.

The surface modifying element of the present invention may optionally contain additional layers, such as an adhesive layer 9 or a release coating 6.

If the carrier substrate is to remain on the receptor 20, the adhesive layer 9 may be on the opposite side of the carrier substrate from the photosensitive layer. Preferably, however, the carrier substrate 3 is removed after the surface modifying element is laminated to the proof. In this situation the adhesive layer 9 is on the opposite side of the photosensitive layer 2 from the carrier substrate 3. The adhesive layer preferably is 0.5 to 20 µm, more preferably 1 to 15 µm. Suitable adhesive materials include thermal adhesives. The solvent used for this coating must not attack or interact with the adjacent layer. Examples of solvents include alcohols, water and hydrocarbon solvents. Because hydrocarbon solvents like heptane and naphtha are prone to irregular coating patterns, production is very difficult, more polar solvents such as water and alcohols are preferred. Some examples of thermal resins which may be used include; vinyl acetate polymers and copolymers, acrylic and methacrylic polymers, copolymers and terpolymers, polyvinylacetals and acrylamide copolymers and terpolymers. Vinyl acetate polymers have been found to be very sensitive to moisture and can cause blocking of the coated materials in shipment and storage if the vinyl acetate component of the adhesive is present at amounts greater than 20%. The preferred thermoplastics resins non-exclusively include; copolymers of vinyl acetate which contain less than 20% vinyl acetate, Wallpol™ 40165 available from Reichhold (terpolymer of vinyl acetate/methyl methacrylate/butyl acrylate), Synthemul™ 97-603 available from Reichhold (terpolymer of N-(hydroxymethyl) acrylamide/butyl acrylate/methyl methacrylate), and copolymers of alkyl acrylates and alkyl methacrylates. Other additives may be present to aid in coating and performance such as surfactants, coalescence aids, plasticizers, UV absorbers, etc.

A release coating 6 may also be used. As shown in FIGS. 1b and 2a–2c, the release coating may be used between the photosensitive layer and the carrier substrate to facilitate removal of the carrier substrate following lamination of the surface modifying element to the receptor 20. The release layer releases from the carrier and clings to the photosensitive color layer after lamination to a receiver and subsequent removal of the carrier. In addition to facilitating removal of the carrier substrate, the release layer is also effective in preventing a photomask or negative 21 from adhering to the photosensitive layer during imaging as shown in FIGS. 2b and 3a.

The release layer is coated onto the carrier using an aqueous solution of water soluble resins. Preferred water soluble resins non-exclusively include alkyl ethers of cellulose, polyvinyl alcohols and polyvinyl pyrolidone. The release properties of the layer can be controlled by the incorporation of a water soluble surfactant. Preferred surfactants non-exclusively include alkylarylpolyether alcohols, glycerin and ethoxylated castor oil. In the preferred embodiment, the surfactant is present in the release layer in the amount of 0.1–5% by weight of solids in the layer, more preferably 0.5–2%. Other ingredients may be added such as mold inhibitors, anti-halation dyes, filter dyes, solvents, wetting agents, etc. The release coating 6 preferably is 0.3 to 1.5 µm.

Other layers as are known to one skilled in the art, such as barrier layers, primers, etc. may be used provided they do not effect the formation of matte images.

Process for Creating Image-Wise Variation of Gloss on a Receiver

One method of creating a receptor having imagewise variation in glossiness comprising the steps of:

a) providing a surface modifying sheet which comprises a carrier substrate, and, on one side of the carrier substrate, a photosensitive layer comprising i) a binder selected from the group consisting of photopolymerizable binders and photosolubilizable binders and ii) particulates having sizes in the range of 500 to 1500 nm;

b) image-wise exposing the photosensitive layer to actinic radiation;

c) developing the imagewise exposed photosensitive layer; and d) applying the imaged and developed surface modifying sheet to the receptor.

According to this method, as shown in FIGS. 3a–3b, the surface modifying sheet 1 is image-wise exposed and developed first. Imagewise exposure may be performed by exposure to actinic radiation 30 through a mask 21 as shown in FIG. 3a or by any other known method. The mask is placed over the surface modifying element 1 and is removed after imagewise exposure. The sheet is developed by removal of the removable portions of the photosensitive layer. Whether the exposed or unexposed portions are removed depends upon whether the system is a photopolymerizable system or a photodegradable (or photosolubilizable) system.

Suitable developers for typical positive systems include aqueous solutions with pH of 7 to 14. For the preferred negative systems, the developer solutions used to develop the image after exposure are typically comprised of a combination of sodium or potassium carbonate, and sodium or potassium bicarbonate and a surfactant. In the preferred embodiment the carbonate concentration is in an amount 0.5–2% by weight, the bicarbonate concentration is in the amount 0–1% by weight, and the surfactant concentration is in the amount 0.1–1% by weight of the total developer solution and the balance is water. The preferred surfactants non-exclusively include; Surfynol™ 465 (ethoxylated tetramethyl decynediol); Air Products; Surfactol™ 365 (ethoxylated castor oil); CasChem; Triton X-100 (octylphenoxypolyethoxyethanol) and Surfynol™ GA (acetylenic diols compounded with other non-ionic surfactants and solvents); Air Products.

The developed sheet 13 may then be laminated to or removably placed on a receiver on the receiver 20 (see FIG. 3b) to form a element 40 with imagewise variation in glossiness. The surface modifying particulates in the photosensitive layer 2 provide a matte surface 12 where the photosensitive material remains after development. The portions of the sheet where the photosensitive material has been removed reveal a second surface 11 which has a different optical gloss characteristic which is controlled by the surface characteristics of the carrier substrate 3. Preferably, the second surface 11 is glossier than the surface 12. As a variation of this embodiment, the carrier sheet side of an unexposed undeveloped sheet is laminated to the receiver followed by subsequent exposure and development.

An alternate method of creating a receptor having imagewise variation in glossiness comprising the steps of:
a) providing a surface modifying sheet which comprises a carrier substrate, and, on one side of the carrier substrate, a photosensitive layer comprising i) a binder selected from the group consisting of photopolymerizable binders and photosolubilizable binders and ii) particulates having sizes in the range of 500 to 1500 nm;
b) applying the surface modifying sheet to the receptor in a manner so that the photosensitive layer is between the receptor and the carrier substrate;
c) removing the carrier substrate;
d) image-wise exposing the photosensitive layer to actinic radiation; and
e) developing the imagewise exposed photosensitive layer, wherein the photosensitive layer may be exposed to actinic radiation before the application of the surface modifying sheet to the receptor, after the application of the surface modifying sheet to the receptor and before removal of the carrier substrate, or after the removal of the carrier substrate.

Figure 2B:
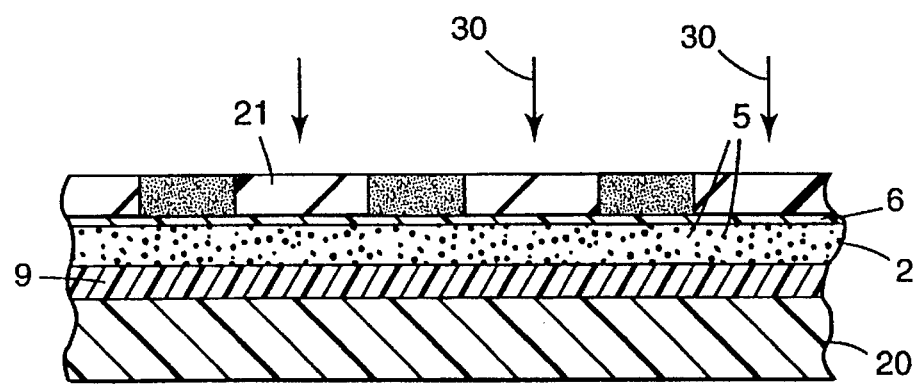
Figure 2C:
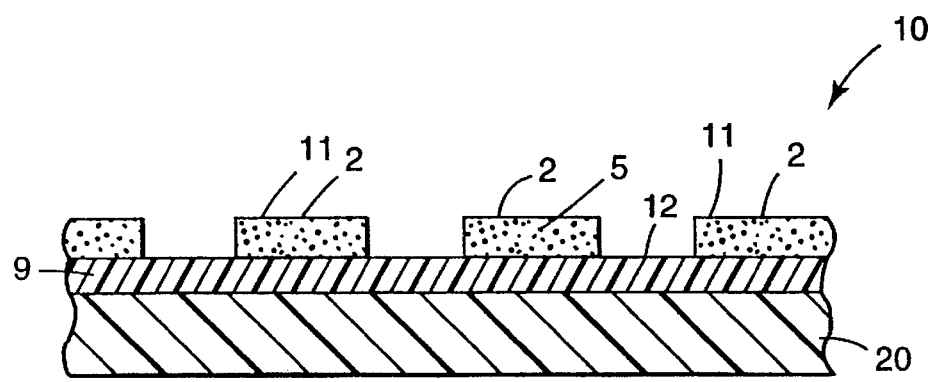

FIGS. 2a–2c show an example of one embodiment of this alternate method of imparting imagewise variation in surface characteristics wherein the photosensitive side of the surface modifying sheet 1' is laminated to the receptor element 20 to form an element 50. The carrier substrate 3 is then removed as shown in FIG. 2a. The photosensitive layer is imagewise exposed to actinic radiation 30 through a photomask 21, as shown in FIG. 2b, or by any other known method. Imagewise exposure could also occur before the removal of the carrier substrate if the substrate is transparent. The imagewise exposed photosensitive layer is developed as discussed above thereby creating an element 10. The surface 11 has optical characteristics controlled by the carrier substrate 3, while the surface 12 shows matte or deglossed characteristics.

It is important to realize that which portion is rendered matte by the particulates in the photosensitive layer is controlled by the order of coating of the surface modifying sheet. Specifically, when the photosensitive layer is coated on a smooth substrate that interface is and remains smooth. The opposite side of the photosensitive layer has a matte surface. If the coating order were reversed, the opposite surfaces would be matte and smooth.

An alternative method of producing imagewise variation in gloss may be effected by coating a photosensitive layer on a matte substrate. The interface between the substrate and the photosensitive layer is irregular and will create a deglossed appearance whenever either surface of that interface is exposed. Imagewise variation is accomplished by imagewise exposure of the photosensitive layer to radiation and subsequent development.

The use of these methods provides variation in surface gloss which is detectable by the human eye. However, preferably those regions which are matte have a 75° gloss, as measured according to test standard T480 om-92, of no more than 40%, more preferably less than 38%. Those regions which are gloss preferably have a 75° gloss, as measured according to test standard T480 om-92, of at least 45%, more preferably at least 50% and most preferably at least 55%.

EXAMPLES

Example 1

A photopolymer solution containing the following ingredients was prepared: 17.1 g of a solution of low molecular weight multifunctional urethane oligomer as disclosed at col. 10, line 67 to col. 11, line 35 of U.S. Pat. No. 4,304,923 in methyl ethyl ketone (MEK) (40% by weight solids); 5.8 g of a solution of Joncryl™ 67 acrylic resin from S. C. Johnson Polymer Co. in MEK solvent 35% by weight solids; 0.13 g of a solution of Butvar B-98 (Polyvinyl butyral from Monsanto) in 60/40 MEK/Solv-PM™ (from Union 76) solvent at 22% by weight solids; 0.04 g of a solution of tethered meta most-ol as described in U.S. Pat. No. 5,298,361, col. 27, line 15–44 in Solv-PM™ solvent at 50% by weight solids; 0.04 g of a solution of FC-430 (Minnesota Mining and Manufacturing Company) in MEK solvent at 10% by weight solids; 6.72 g MEK (methyl ethyl ketone); and 4.48 g Solv-PM.

One point five grams of a 10% dispersion of amorphous fumed silica (Cab-o-Sil grad MS-7 from Cabot Co.) in MEK/Solv-PM 60/40 solvent were added to 4 g of the above prepared solution. The amorphous fumed silica had an average particle size of 7 nm. After mixing for 10 minutes this solution was coated onto a 2 mil pre-PVA coated P-56 (from Minnesota Mining and Manufacturing Co.) polyester base at a coating weight of 200–300 mg/ft$^2$ (0.21–0.32 mg/cm$^2$) at 200° F. (93° C.). A layer of Reichhold Synthemul™ 97–603 adhesive (dry thickness of about 3 μm) was applied over the photosensitive layer. The coated side of this film was placed onto the coated side of a four color finished negative Matchprint™ III proof and the sheets were sent through a laminator. The polyester base coat was peeled away. A mask was placed over the laminated article and the article was exposed to UV radiation. The exposed article was developed to remove the unexposed portions of the photosensitive layer. The resulting proof had a smooth finish in the areas were the cured photosensitive layer remained and a matte finish in areas where the photosensitive layer had been removed.

Example 2

The process of claim 1 was repeated except that the surface modifying element was laminated to a black sheet. The gloss of the sheet in the areas where portions had been removed during development was from 55 to 75 and in the regions where the photosensitive layer remained was 107 as measured by 60 degree gloss on a Hunterlab Model D48D Glossmeter.

What is claimed is:
1. A method of creating a receptor having imagewise variation in glossiness comprising the steps of:
a) providing a surface modifying sheet which comprises a carrier substrate, and, on one side of the carrier substrate, a colorless photosensitive layer having a thickness from 0.3 to 5 μm and comprising (i) particulates having sizes smaller than the thickness of the photosensitive layer and (ii) a binder selected from the group consisting of photopolymerizable binders and photosolubilizable binders;
b) applying the surface modifying sheet to the receptor in a manner so that the photosensitive layer is between the receptor and the carrier substrate;
c) removing the carrier substrate;
d) image-wise exposing the photosensitive layer to actinic radiation; and e) developing the imagewise exposed photosensitive layer, wherein the photosensitive layer may be exposed to actinic radiation before the application of the surface modifying sheet to the receptor, after the application of the surface modifying sheet to the receptor and before removal of the carrier substrate, or after the removal of the carrier substrate.

2. The method of claim 1 in which the receptor is a proof.

3. The method of claim 1 in which the binder is a photopolymerizable binder.

4. The method of claim 1 in which the photosensitive binder is a photosolubilizable binder.

5. The method of claim 1 wherein the particulates are selected from the group consisting of silica, polymeric beads, glass beads, and mica.

6. The method of claim 1 wherein the particulates are silica.

* * * * *